(12) United States Patent
Lanniel et al.

(10) Patent No.: US 12,163,812 B2
(45) Date of Patent: Dec. 10, 2024

(54) CIRCUIT FOR OPERATING A CAPACITIVE SENSOR AND ASSOCIATED SENSOR DEVICE

(71) Applicant: Robert Bosch GmbH, Stuttgart (DE)

(72) Inventors: Alice Lanniel, Tuebingen (DE); Tobias Meier, Stuttgart (DE)

(73) Assignee: ROBERT BOSCH GMBH, Stuttgart (DE)

(*) Notice: Subject to any disclaimer, the term of this patent is extended or adjusted under 35 U.S.C. 154(b) by 280 days.

(21) Appl. No.: 17/910,111

(22) PCT Filed: Mar. 8, 2021

(86) PCT No.: PCT/EP2021/055766
§ 371 (c)(1),
(2) Date: Sep. 8, 2022

(87) PCT Pub. No.: WO2021/180642
PCT Pub. Date: Sep. 16, 2021

(65) Prior Publication Data
US 2023/0100447 A1    Mar. 30, 2023

(30) Foreign Application Priority Data

Mar. 10, 2020    (DE) ............... 10 2020 203 036.7

(51) Int. Cl.
*G01D 5/24*    (2006.01)
*G01P 15/125*   (2006.01)
*H03K 17/975*   (2006.01)

(52) U.S. Cl.
CPC .............. *G01D 5/24* (2013.01); *G01P 15/125* (2013.01); *H03K 17/975* (2013.01); *H03K 2217/9651* (2013.01)

(58) Field of Classification Search
CPC ........ G01D 5/24; G01D 5/241; G01P 15/125; G06F 3/044; H03K 17/975; H03K 2217/9651; H03K 2217/9658
See application file for complete search history.

(56) References Cited

U.S. PATENT DOCUMENTS

| | | | |
|---|---|---|---|
| 2008/0079444 A1* | 4/2008 | Denison ................... | G01D 5/24 324/679 |
| 2012/0062244 A1* | 3/2012 | Santana .................... | G01L 9/12 324/658 |

FOREIGN PATENT DOCUMENTS

| | | |
|---|---|---|
| EP | 0718631 A2 | 6/1996 |
| EP | 2428774 A1 | 3/2012 |

OTHER PUBLICATIONS

International Search Report for PCT/EP2021/055766, Issued Jun. 21, 2021.

(Continued)

*Primary Examiner* — Son T Le
(74) *Attorney, Agent, or Firm* — NORTON ROSE FULBRIGHT US LLP; Gerard A. Messina

(57) ABSTRACT

A circuit for operating a capacitive sensor configured to be operated alternately in a first mode over a first time interval and in a second mode over a second time interval. The circuit includes a GM stage configured to receive a sensor voltage of the capacitive sensor at a first input contact and convert the sensor voltage into a sensor current to charge a first boxing capacitor with the sensor current in the second time interval, an integrator that is configured to, in the second interval, integrate a voltage applied across the first boxing capacitor over its time curve and output a resulting output voltage at a first output, and a hold circuit configured to tap the output voltage of the integrator in the second interval and hold it as a hold voltage.

10 Claims, 4 Drawing Sheets

(56) References Cited

OTHER PUBLICATIONS

Petkov et al., "A Fully Differential Charge-Balanced Accelerometer for Electronic Stability Control", IEEE Journal of Solid-State Circuits, vol. 49, No. 1, Jan. 2014, pp. 262-270.
Ezekwe, "Readout Techniques for High-Q Micromachined Vibratory Rate Gyroscopes", Ph.D. dissertation, University of California, Berkeley, 2007, 94 pages.

* cited by examiner

Overview

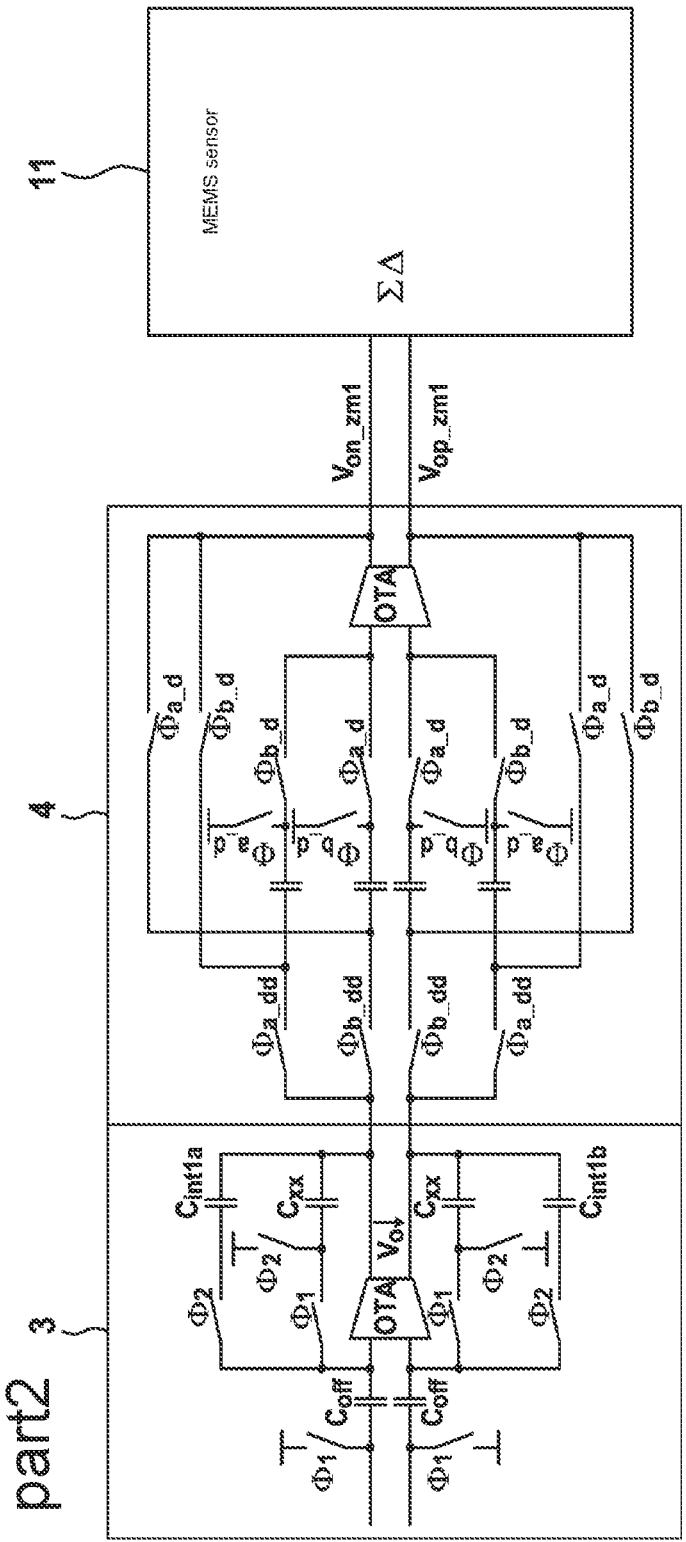
Fig. 3B part2

CIRCUIT FOR OPERATING A CAPACITIVE SENSOR AND ASSOCIATED SENSOR DEVICE

FIELD

The present invention relates to a circuit for operating a capacitive sensor.

BACKGROUND INFORMATION

Due to the small size, low costs, and low power consumption of MEMS sensors, the demand for such sensors has greatly increased in recent years. Depending on the application of such a sensor, the design of the associated circuits varies as a function of the given requirements. Different types of circuits, which are optimized for different specific parameters, are available for operating capacitive sensors. In particular, circuits for operating acceleration sensors may be subdivided into two main groups, which involve force feedback sensors and open-loop sensors.

In force feedback sensors, a counterforce, usually an electrostatic force, is applied to counteract a deviation of an inertia weight from its nominal position, and in open-loop sensors the suspended inertia weight is freely movable. Numerous properties of the sensor are enhanced via a force feedback implementation. Such a design thus allows a greater dynamic range, better linearity, greater sensitivity, and a larger signal bandwidth.

For the open-loop architecture, a particularly compact design is made possible, and lower power consumption is achieved. In addition, sensors in the open-loop architectures are easier to implement than force feedback sensors.

A compromise between these architectures is achieved by using a charge balance architecture. This third architecture for a sensor interface is a combination of the open-loop architecture and the force feedback architecture. Feedback is provided to the sensor in order to set a voltage that is present at the sensor, this voltage not being used to prevent a movement of the inertia weight.

A sensor architecture that is based on a charge balance architecture is described in the paper by J. B. Vladimir, P. Petkov, Ganesh K. Balachandran, "A fully differential charge-balanced accelerometer for electronic stability control," IEEE Journal of Solid-State Circuits, Vol. 49, No. 1, pp. 262-270, January 2014. A voltage that is applied to both sides of a capacitive bridge of the sensor is provided by a negative feedback loop. An input-side circuit includes an input amplifier stage for amplifying and integrating a first signal. In addition, this circuit includes two summing amplifiers that provide the feedback voltage to the sensor. Furthermore, this architecture includes a sigma-delta modulator to convert a second signal into a bitstream that is processed by an output-side circuit.

The dissertation by C. D. Ezekwe, "Readout techniques for high-q micromachined vibratory rate gyroscopes," Ph.D. dissertation, University of California, Berkeley, 2007, provides a circuit, for operating a capacitive sensor, that is implemented as a closed loop in order to operate a capacitive MEMS gyroscope. The circuit includes a GM stage that is suitable for converting and amplifying a sensor signal. The circuit also includes an analog-to-digital converter that is suitable for digitizing the sensor signal.

European Patent No. EP 2428774 B1 provides an electrical circuit for measuring a capacitive value of a MEMS sensor. Boxcar sampling, among other techniques, is used.

SUMMARY

A circuit according to an example embodiment of the present invention for operating a capacitive sensor is configured to be operated alternately in a first mode over a first time interval and in a second mode over a second time interval. The circuit includes a GM stage, an integrator, and a hold circuit. The GM stage includes a first input contact and a second input contact, and is configured to receive a sensor voltage of the capacitive sensor at the first input contact of the GM stage and to convert the sensor voltage into a sensor current in order to charge a first boxing capacitor with the sensor current in the second time interval. The integrator is configured, in the second time interval, to integrate a voltage applied across the first boxing capacitor over its time curve and to output an output voltage resulting therefrom at an output of the integrator. The hold voltage is configured to tap the output voltage of the integrator in the second time interval and to hold it as a hold voltage at an output of the hold circuit. The circuit is also configured to provide, in the first time interval and in the second time interval, the hold voltage to the capacitive sensor as feedback voltage and to an analog-digital converter as input voltage to be converted, and to discharge the first boxing capacitor in the first time interval.

The circuit for operating the capacitive sensor is configured to be operated alternately in a first mode over a first time interval and in a second mode over a second time interval. This means that either the first mode or the second mode is present in alternation. A further time interval is optionally present between the first time interval and the second time interval. The circuit may thus be utilized with at least two or at least three phases.

The GM stage is a circuit that is suitable for converting an input voltage, present at the input contacts of the GM stage, into a current. Via the GM stage, a sensor voltage of the capacitive sensor is therefore received and converted into a sensor current. This preferably takes place with the aid of a transconductance amplifier whose inputs are coupled to the input contacts. A boxing capacitor is charged with the sensor current provided by the GM stage. The boxing capacitor is preferably encompassed by the GM stage. Alternatively, the boxing capacitor is a capacitor that is coupled to an output of the GM stage. The boxing capacitor is thus in particular a capacitor of the integrator.

The integrator is configured to integrate the voltage present across the boxing capacitor over its time curve. The integration takes place in the second time interval. In particular, the integration takes place over multiple, in particular all, successive second time intervals. The integrator is preferably configured to hold an integration value in the first time interval in order to continue the integration process in the subsequent second time interval. The integrator is thus preferably configured to integrate the voltage present across the first boxing capacitor over all second time intervals in which the circuit is operated.

The hold circuit is configured, in the second time interval, to tap the output voltage of the integrator and hold it as hold voltage at an output. The hold circuit is preferably reset before it taps the output voltage of the integrator. This optionally takes place in the first time interval or in the second time interval, only a portion of the first time interval or of the second time interval being necessary for this purpose. The hold circuit is thus preferably reset at the end of the first time interval or at the beginning of the second time interval. The hold circuit is preferably configured to hold the output voltage of the integrator in the first time interval and in the second time interval, the output voltage of the integrator, except for a time interval in which the hold circuit is reset, preferably being held over the entire first time interval and the entire second time interval.

The circuit is configured to provide the hold voltage to the capacitive sensor as feedback voltage in the first time interval and/or in the second time interval. The hold voltage is preferably led back, via a feedback channel, to the inputs of the capacitive sensor at which an operating voltage of the capacitive sensor is also present, in order to provide a negative feedback channel. The operating voltage of the capacitive sensor is typically a reference voltage that is applied for an operation of the capacitive sensor at its sensor inputs.

The hold voltage is provided to an analog-digital converter, in particular a delta-sigma converter, that converts the hold voltage into a digital output signal, which is provided as a measured value of the capacitive sensor. The analog-digital converter is optionally part of the circuit. Alternatively, the analog-digital converter is a separate structural unit that is coupled to the circuit.

The circuit is configured to discharge the first boxing capacitor in the first time interval. In other words, this means that in the first time interval an average value formation that takes place via the boxing capacitor is interrupted and reset. As a result of the boxing capacitor being charged over the second time interval, an average value formation takes place, since fluctuations in the sensor voltage based on interfering influences are mutually compensated for during charging of the first boxing capacitor with the sensor current over its time curve. As the result of only a shift of an offset of the sensor current between two second time intervals, a charge that has accumulated in the first boxing capacitor during the second time intervals is different. Thus, due to the average value formation that is made possible by the first boxing capacitor, noise from the output signal of the sensor is removed and is not present at the input of the analog-digital converter.

The sensor voltage of the capacitive sensor is in particular present only at the first input contact of the GM stage. Conversely, this means that no sensor voltage of the capacitive sensor, in particular of any capacitive sensor, is present at the second input contact of the GM stage.

The sensor voltage is a voltage that results at an output contact of the capacitive sensor and that describes a voltage difference from a ground potential. The capacitive sensor and the circuit for operating the capacitive sensor are thus preferably at a shared ground potential.

A particularly compact circuit, and in combination with the capacitive sensor a particularly compact sensor device, are thus provided. The sensor device includes the circuit according to the present invention and the capacitive sensor, the capacitive sensor in particular including two capacitive elements that are connected to form a bridge, and a shared potential of the capacitive elements is coupled to the first input contact of the GM stage, and the external contacts of the bridge are coupled to the output of the hold circuit in order to be acted on by the hold voltage.

In addition, a circuit with low sensitivity to noise is provided which also has the advantages of a charge balance architecture. One advantage of the circuit design, based on the charge balance architecture, over a circuit based on a closed-loop architecture is that less circuit complexity with lower energy consumption is achieved, and a further advantage over a circuit based on an open-loop architecture is that greater linearity is achieved. The improved noise behavior is achieved by use of the GM stage at an input side of the circuit, which is also an amplifier stage. In particular, a single-core sensor in combination with the circuit for operating the capacitive sensor is used, thus reducing the required surface area for implementing the sensor device.

The circuit according to the present invention thus allows high linearity, stability against vibrations and electromagnetic influences, low output noise, and a small installation surface area. The capacitive sensor is in particular a single-core sensor, i.e., a capacitive sensor that includes an individual inertia weight. According to the present invention, boxcar sampling is implemented by the GM stage to reduce noise in the sensor design based on a charge balance principle. The circuit is preferably implemented on a circuit surface area that is as small as possible, the requirements resulting from the automotive field preferably being met. The sensor device is thus in particular a sensor device for automotive use.

Preferred refinements of the present invention are disclosed herein.

According to an example embodiment of the present invention, the GM stage, the integrator, and the hold circuit are each preferably differential circuits. This means that the GM stage, the integrator, and the hold circuit each include two input contacts and two output contacts. The voltages present at the two output contacts are preferably both based on an associated ground of the circuit. The circuit according to the present invention thus makes it possible for an individual capacitive sensor, which provides no differential output signal, to be subjected to signal processing by the circuit, in which the advantages of a differential circuit are utilized.

It is also advantageous when the circuit is configured to switch the second input contact of the GM stage into a floating state in the second time interval. It is further preferred that the circuit is configured to couple the second input contact of the GM stage to a circuit ground in the second time interval via a ground capacitor. This makes it possible for an input signal for a differential circuit to be provided by a nondifferential sensor in the second time interval. The second input contact of the GM stage is preferably also coupled to the circuit ground in the first time interval via the ground capacitor. It is thus ensured that the sensor voltage may be received from the GM stage. In particular, a sufficient amplitude of the sensor voltage is ensured.

It is also advantageous when the circuit is configured to couple the second input contact of the GM stage to the output of the hold circuit in the first time interval. The same voltage is preferably applied to the second input contact as that also applied to the first input contact in the first time interval. An input signal that is present via the input contacts of the GM stage, i.e., a voltage drop between the first input contact and the second input contact of the GM stage, is thus minimized. Thus, in particular the first input contact of the GM stage is also coupled to the output of the hold circuit in the first time interval in order to achieve a minimum voltage difference between the input contacts of the GM stage. At the same time, it is ensured that a charge that is present in the capacitive sensor is maintained, since the first input contact is not at a zero potential or a ground potential.

According to an example embodiment of the present invention, the GM stage preferably also includes a chopping circuit that is configured to lead the sensor current to the first boxing capacitor in a first chopping time interval, and to a second boxing capacitor in a second chopping time interval, in order to charge the boxing capacitors with the sensor current in the second time interval of the particular chopping time interval. The chopping circuit is preferably also configured to lead a sensor current to the second boxing capacitor in the first chopping time interval, and to the first boxing capacitor in a second chopping time interval, in order to charge the boxing capacitors with the sensor current in the second time interval of the particular chopping time interval. The sensor currents are preferably provided at different outputs of a differential amplifier. The first boxing capacitor and the second boxing capacitor are in particular situated on different paths of the differential GM stage or of the differential integrator. The GM stage is thus preferably configured to couple the first boxing capacitor to the first input contact in the first chopping time interval. In addition, the GM stage is preferably configured to couple the second boxing capacitor to the first input contact in the second chopping time interval. In the first chopping time interval, the second boxing capacitor is preferably coupled to the second input contact via a second amplifier output of an amplifier of the GM stage, and in the second chopping interval the first boxing capacitor is coupled to the second input contact via a first amplifier output of the amplifier of the GM stage. The chopping circuit is in particular a cross switch or a circuit via which the function of a cross switch is achieved, which connects the two differential paths of the GM stage. The chopping circuit is a circuit that alternately couples the first input contact and the second input contact of the GM stage or the outputs of an amplifier of the GM stage to different differential paths of the differential GM stage. The chopping circuit in the first time interval preferably operates similarly as in the second time interval. A first time interval and a second time interval are thus present in each case in the first chopping time interval and also in the second chopping time interval. As a result, the signal provided by the sensor, i.e., the sensor voltage and the resulting sensor current, is/are available in both differential paths of the circuit. If one considers a differential signal of the GM stage, a polarity of the differential signal is changed with the chopping time interval.

It is also advantageous when the circuit is configured to couple the second input contact of the GM stage, via a feedback path, to the output of the hold circuit in the first time interval of the first chopping time interval in such a way that a voltage that results from a common mode voltage plus one-half the hold voltage is present at the output of the hold circuit, and to couple the second input contact of the GM stage, via a feedback path, to the output of the hold voltage circuit in the first time interval of the second chopping time interval in such a way that a voltage that results from a common mode voltage minus one-half the hold voltage is present at the output of the hold circuit. The common mode voltage is a voltage that is present at a common mode potential of the circuit and that is a common mode voltage of the differential components. One-half the hold voltage is in particular a voltage that is present between the common mode potential and an output contact of the hold circuit, in particular the differential hold circuit. In particular, during the first chopping interval an output voltage of the hold stage is completely or partly applied with a first polarity to the first input contact and the second input contact of the GM stage, and also to a first input contact and a second input contact of the capacitive sensor. Similarly, in a second chopping time interval this output voltage of the hold circuit is preferably applied with reversed polarity to the corresponding input contacts of the GM stage and of the capacitive sensor.

The first chopping time interval and the second chopping time interval either have the same temporal duration, different durations, or durations that are selected randomly. The chopping circuit is thus suited in particular for improving compatibility with electromagnetic interferences in a broadband spectrum. Fs/2 chopping, i.e., chopping with a first chopping time interval and a second chopping time interval having identical lengths, may possibly not be sufficient due to the fact that interferences are coupled back into the baseband, which may be critical in particular for automotive applications. Random chopping may therefore be advantageously used in such a way that the energy of the interferences is distributed over a wider bandwidth, so that only a small portion of the EMC influences appear in the signal band. The chopping is thus suitable for removing narrowband noise, for example flicker noise or offset noise. The chopping circuit preferably also includes a switching element in the coupling path between the hold circuit and the capacitive sensor. Due to the associated dechopping switches, the hold voltage may be led to the corresponding input contacts of the capacitive sensor with the desired polarity. The chopping circuit thus preferably includes a two-part circuit, the polarity being reversed twice in a differential path. Chopping and dechopping thus take place. Alternatively, the switches necessary for the dechopping may be situated at an output of the integrator, thus enabling EMC robustness and an offset cancellation of the GM stage and of the integrator. By use of the chopping circuit, buildup of charges within the sensor is also avoided.

In addition, according to an example embodiment of the present invention, it is advantageous when the circuit includes a neutralization capacitor, a first side of the neutralization capacitor being coupled to the first input contact of the GM stage, and a second side of the neutralization capacitor being configured to be selectively coupled to the output of the hold circuit via a feedback path in such a way that at the second side of the neutralization capacitor, a voltage that results from the common mode voltage plus one-half the hold voltage is present, or to be coupled to the output of the hold circuit via a feedback path in such a way that at the second side of the neutralization capacitor, a voltage that results from the common mode voltage minus one-half the hold voltage is present. In particular in the first time interval, in each case such a voltage, which corresponds to the voltage that is applied to the second input contact of the GM stage, is applied to the second side of the neutralization capacitor. High linearity is ensured by the neutralization capacitor. Since the capacitors of the capacitive sensor may involve feedthrough capacitors, their influence may be compensated for by the neutralization capacitor. The neutralization capacitor is optional, and is not required when the influence of the feedthrough capacitors may be ignored. In particular when a neutralization capacitor is utilized, the output signal of the hold circuit, and thus of the integrator, is required during the first time interval and the second time interval.

It is also advantageous when the first boxing capacitor and/or the second boxing capacitor are/is capacitor(s) of the integrator. A particularly compact circuit is thus provided, since the number of required capacitors is reduced.

Furthermore, it is advantageous when the capacitive sensor is a MEMS sensor, in particular an acceleration sensor or a MEMS gyroscope.

BRIEF DESCRIPTION OF THE DRAWINGS

Exemplary embodiments of the present invention are described in greater detail below with reference to the figures.

FIGS. 3A and 3B show a sensor device that includes a circuit for operating a capacitive sensor according to a second specific embodiment of the present invention.

DETAILED DESCRIPTION OF EXAMPLE EMBODIMENTS

Figure 1:
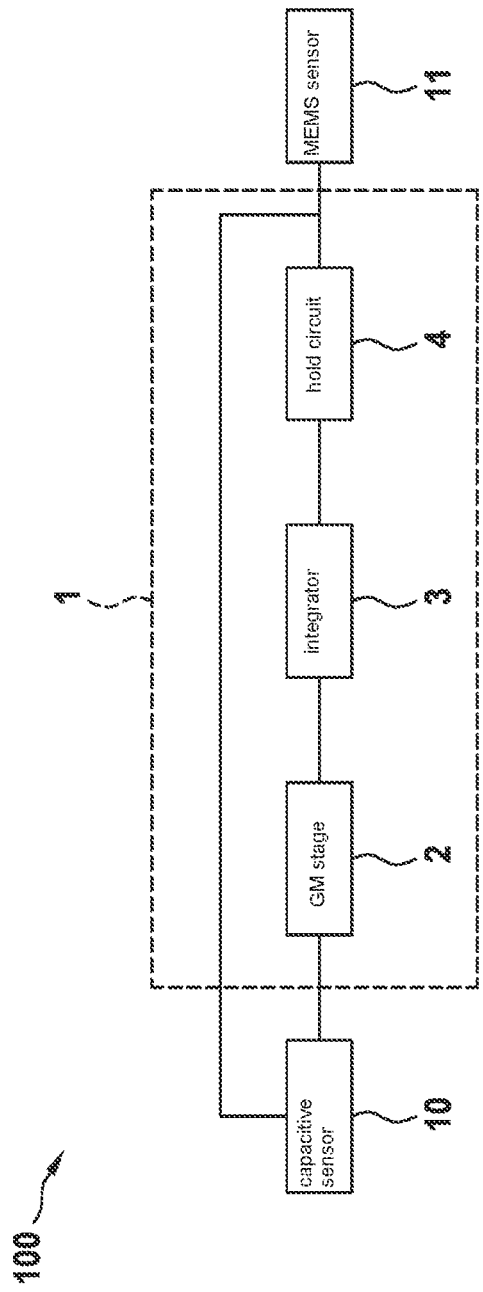
FIG. 1 shows a block diagram of a sensor device according to an example embodiment the present invention, which includes a circuit according to an example embodiment of the present invention.

FIG. 1 shows a block diagram of a sensor device 100. Sensor device 100 includes a circuit 1 for operating a capacitive sensor 10. Capacitive sensor 10 is a MEMS sensor, in particular an acceleration sensor or a MEMS gyroscope. MEMS sensor 11 is in particular a single-core sensor. Circuit 1 is thus a circuit for operating a MEMS sensor.

Sensor 10 includes an input side and an output side. The output side of capacitive sensor 10 is coupled to a GM stage 2. An output signal, in the present case a sensor voltage, of capacitive sensor 10 is converted by the GM stage into a sensor current, and boxcar sampling is carried out. An output side of GM stage 2 is coupled to an integrator 3. An output side of integrator 3 is coupled to an input side of a hold circuit 4.

An integration over a time curve of a state of charge of a boxing capacitor, which is charged with the sensor current of GM stage 2, takes place via integrator 3. The resulting output voltage of integrator 3 is sampled by hold circuit 4, held, and provided as hold voltage at an output side of hold circuit 4. The hold voltage is provided as feedback voltage to capacitive sensor 10. In addition, an analog-digital converter 11, preferably a sigma-delta converter, is coupled to the output side of hold circuit 4. Analog-digital converter 11 is thus provided with the hold voltage as input voltage to be converted. Alternatively, the output of the integrator may also be provided to analog-digital converter 11 as input voltage to be converted.

Due to hold circuit 4 holding the output signal of the integrator, this results in the option for the boxing capacitor, which is necessary for the boxcar sampling, to be resettable, and at the same time for a state of charge of the capacitors of capacitive sensor 10 to be obtained. A sensor device is thus provided that ensures a charge compensation of capacitive sensor 10. Such a circuit, as also shown in FIG. 1, is also referred to as a charge balance sensor.

Figure 2:
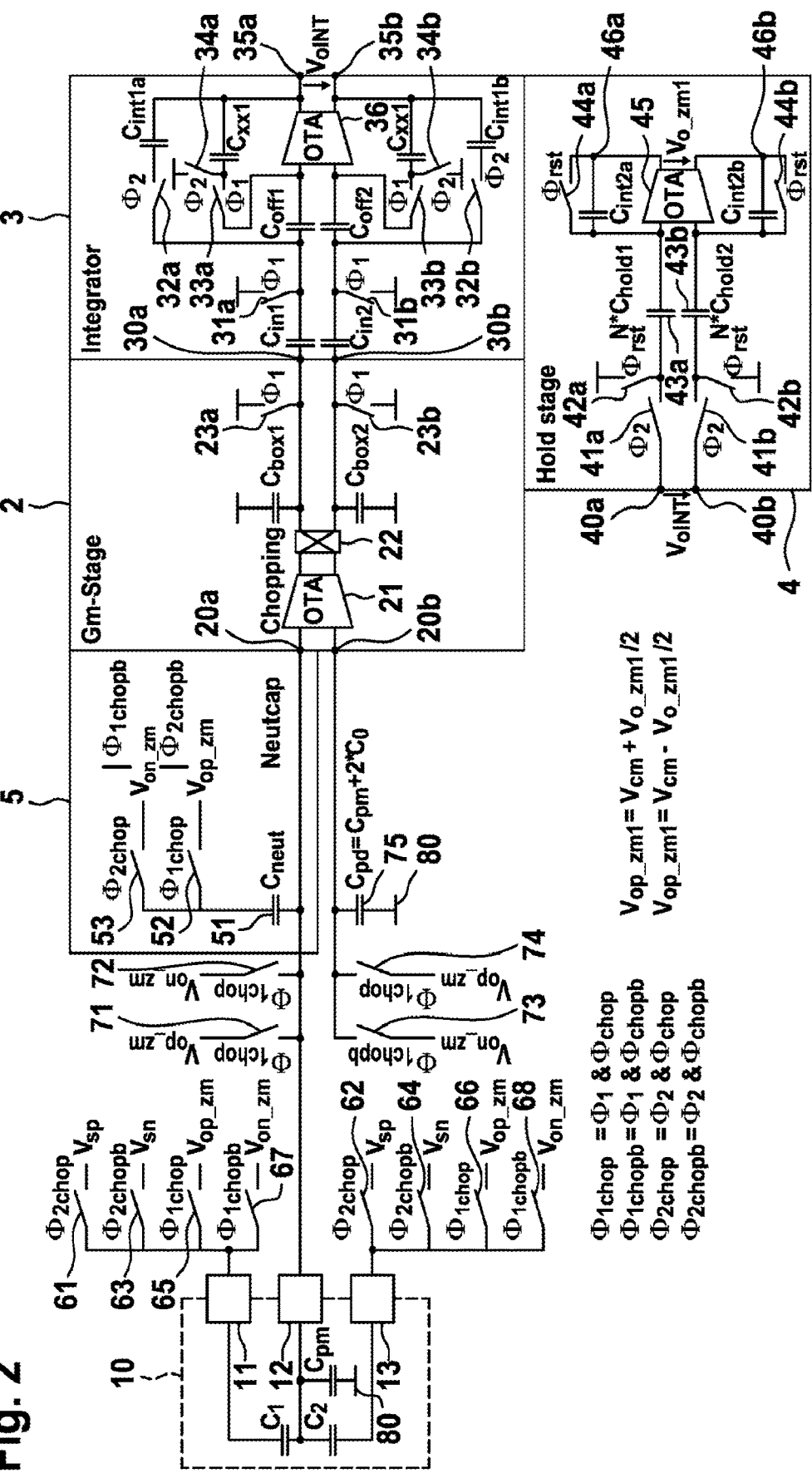
FIG. 2 shows a sensor device that includes a circuit for operating a capacitive sensor according to a first specific example embodiment of the present invention.

FIG. 2 shows a first specific embodiment of the present invention, the circuit shown in FIG. 2 having the design shown in FIG. 1.

Capacitive sensor 10 includes a first capacitor C1 and a second capacitor C2. First capacitor and second capacitor C1, C2 are the capacitive elements of capacitive sensor 10. Each of the capacitive elements is in particular a capacitor that is formed from an inertia weight and a further electrode of capacitive sensor 10 in each case. First capacitor C1 and second capacitor C2 are connected to a bridge. For this purpose, a contact of first capacitor C1 is coupled to a contact of second capacitor C2, as the result of which this shared contact has a shared potential 12, the shared contact at the same time being an output terminal 12 of capacitive sensor 10 at which an sensor voltage of capacitive sensor 10 is provided. The contacts of first capacitor C1 and of second capacitor C2, which are not connected to one another, form two input terminals 11, 13 of capacitive sensor 10. A first sensor input 11 is thus coupled to sensor output 12 via first capacitor C1. In addition, a second sensor input 13 is coupled to sensor output 12 via second capacitor C2. Capacitive sensor 11 optionally includes a ground capacitor Cpm that connects shared potential 12 to a circuit ground 80 of sensor device 100. Ground capacitor Cpm may be a parasitic capacitor.

The shared potential, and thus sensor output 12, is coupled to a first input contact 20a of GM stage 2. Sensor inputs 11, 12 of capacitive sensor 10 are coupled to an output 46a, 46b of hold circuit 4 in order to be acted on by a hold voltage Vo_zm that is held by hold circuit 4 at its output 46a, 46b. This takes place via a plurality of feedback switches 61 through 68, which allow different voltages to be applied to first sensor input 11 and to second sensor input 13. First sensor input 11 is thus coupled in each case to a first side of a first feedback switch 61, of a third feedback switch 63, of a fifth feedback switch 65, and of a seventh feedback switch 67. Similarly, second sensor input 13 is coupled to a second side of a second feedback switch 62, of a fourth feedback switch 64, of a sixth feedback switch 66, and of an eighth feedback switch 68. The second side of the feedback switches is coupled, in each case via a feedback path, to output 46a, 46b of hold circuit 4 and/or to a voltage source that generates a reference voltage.

Sensor output 12 is connected to a first input contact 20a of GM stage 2. In addition, sensor output 12 is connected to a first input potential switch 71 and to an input potential switch 72, via which sensor output 12 may be coupled to an output of hold circuit 4. For this purpose, sensor output 12 is coupled to the output of hold circuit 4 via a feedback path, not shown in FIG. 2. A second input contact 20b of GM stage 2 is coupled to the circuit ground via a second ground capacitor 75. In addition, second input contact 20b of GM stage 2 is coupled to output 46a, 46b of hold circuit 4 via a third input potential switch 73, and a fourth input potential switch 74, respectively, via a feedback path. Via input potential switches 71 through 74, a potential of input contacts 20a, 20b of GM stage 2 is connected to a feedback path that is supplied by hold circuit 4.

GM stage 2, integrator 3, and hold circuit 4 are differential circuits in this first specific embodiment. These differential circuits include a differential signal path, i.e., a two-part signal path. These two paths are referred to below as a first differential signal path and a second differential signal path. The first differential signal path and the second differential signal path have a symmetrical design with respect to one another in GM stage 2, integrator 3, and hold circuit 4, and thus include the same components with the same wiring.

GM stage 2 includes a first amplifier 21 that is a differential transconductance amplifier. A first input of first amplifier 21 is connected to first input contact 20a or forms this first input contact 20a. A second input of first amplifier 21 is connected to second input contact 20b of GM stage 2 or forms this second input contact 20b. GM stage 2 also includes a first boxing capacitor Cbox1 and a second boxing capacitor Cbox2. A terminal of first boxing capacitors Cbox1 is connected to an associated first output of a chopping circuit 22, and a terminal of second boxing capacitors Cbox2 is connected to an associated second output of chopping circuit 22. The two inputs of chopping circuit 22 are each connected to an output of first amplifier 21. The terminals of boxing capacitors Cbox1, Cbox2 that are not connected to chopping circuit 22 are connected to circuit ground 80.

If a sensor voltage is provided by capacitive sensor 10 via its sensor output 12, the sensor voltage is present at first input contact 20a of GM stage 2 and is converted into a sensor current by first amplifier 21. This sensor current is led into first boxing capacitor Cbox1 or into second boxing capacitor Cbox2 as a function of a circuit state of chopping circuit 22.

Circuit 1 for operating capacitive sensor 10 is configured to be operated alternately in a first mode over a first time interval Φ1 and in a second mode over a second time interval Φ2. In this first specific embodiment, circuit 1 is operated solely either in the first mode or in the second mode. This means that either first time interval Φ1 or second time interval Φ2 is present at any point in time. The first mode and the second mode differ in that a plurality of switching elements in sensor device 100 are brought into an appropriate switching state. This is illustrated in FIG. 2 in such a way that the switching elements marked as Φ1 are brought into a closed state in first time interval Φ1. Similarly, the switching elements marked as Φ2 elements are brought into a closed state in second time interval Φ2.

In addition, circuit 1 is alternately operated in a first chopping time interval chop and a second chopping time interval chopb. First chopping time interval chop and second chopping time interval chopb are each subdivided into a first time interval Φ1 and a second time interval Φ2. Thus, first chopping time interval chop is made up of a first time interval Φ1 and a second time interval Φ2. Similarly, second chopping time interval chopb is also made up of a first time interval Φ1 and a second time interval Φ2. This means that in the illustration shown in FIG. 2, in the particular indicated first or second time interval Φ1, Φ2, those switching elements denoted by the index "chop" are switched into a closed state only during first chopping time interval chop. Similarly, this also means that in the particular indicated first or second time interval Φ1, Φ2, the switching elements denoted by the index "chopb" are switched into a closed state only during second chopping time interval chopb. If neither an index chop nor chopb is shown, the particular switching element is switched into a closed state, regardless of the chopping time interval that is present. Whether first chopping time interval chop or second chopping time interval chopb is present is a function of a switching state of a chopping circuit 22.

GM stage 2 is activated in such a way that in first chopping time interval chop, a first output of first amplifier 21 is connected to first boxing capacitor Cbox1, and a second output of first amplifier 21 is connected to second boxing capacitor Cbox2. In second chopping time interval chopb, the first output of first amplifier 21 is connected to second boxing capacitor Cbox2, and the second output of first amplifier 21 is connected to first boxing capacitor Cbox1. In second time interval Φ2, first boxing capacitor Cbox1 and second boxing capacitor Cbox2 are thus connected to the different outputs of the amplifier in alternation as a function of the chopping time interval that is present, and in each case one of the boxing capacitors is thus charged with the sensor current that is provided at the first output by first amplifier 21.

If one regards the sensor current as the current that is output at the first output of first amplifier 21, chopping circuit 22 is configured to lead the sensor current, which is output at the first output of first amplifier 21, to first boxing capacitor Cbox1 in first chopping time interval chop, and to second boxing capacitor Cbox2 in second chopping time interval chopb, in order to charge boxing capacitors Cbox 1, Cbox 2 with the sensor current in first time interval Φ1 of particular chopping time interval chop, chopb. This similarly applies if the sensor current is regarded as the current that is output by the second output of first amplifier 21. However, the sensor current is led to second boxing capacitor Cbox2 in the first chopping time interval, and to first boxing capacitor Cbox1 in the second chopping time interval. Both boxing capacitors Cbox 1, Cbox 2 are charged in second time interval Φ2.

Boxing capacitors Cbox1, Cbox2 are thus alternately charged via the two outputs of first amplifier 21 during the two chopping time intervals chop, chopb. If GM stage 2 is operated in the second mode during second time interval Φ2, boxing capacitors Cbox1, Cbox2 are charged. If GM stage 2 is operated in the first mode, i.e., during first time interval Φ1, boxing capacitors Cbox1, Cbox2 are discharged. For this purpose, GM stage 2 includes a first discharge switch 23a that switches the contact of first boxing capacitor Cbox1, which is also connected to chopping circuit 22, to ground potential 80 in first time interval Φ1. In addition, for this purpose GM stage 2 includes a second discharge switch 23b that switches the contact of second boxing capacitor Cbox2, which is also connected to chopping circuit 22, to ground potential 80 in first time interval Φ1.

The boxing capacitors in Cbox1, Cbox2 are thus charged during second time interval Φ2 and discharged in first time interval Φ1. As the result of boxing capacitors Cbox1, Cbox2 being charged over a certain time interval, an averaging of the incoming sensor current takes place. Forming an average value thus removes noise that is present in the sensor current. Boxcar sampling is thus implemented by GM stage 2.

First boxing capacitor Cbox1 is connected to a first integrator input 30a of integrator 3. Second boxing capacitor Cbox2 is connected to a second integrator input 30b of integrator 3. A voltage that is present across boxing capacitors Cbox1, Cbox2 is integrated over their time curve via integrator inputs 30a, 30b. This takes place in second time interval Φ2. A resulting output voltage Voint is provided at an output 35a, 35b of integrator 3, which includes a first output contact 35a and a second output contact 35b.

Integrator 3 includes a first input capacitor Cin1 and a second input capacitor Cin2. First input capacitor Cin1 is connected to first integrator input 30a. Second input capacitor Cin2 is connected to second integrator input 30b. Via these input-side capacitors of integrator 3, the voltage of boxing capacitors Cbox1, Cbox2 is received and the corresponding charge is transferred to integrator capacitors Cint1a, Cint1b in the next phase. Integrator 3 includes a second amplifier 36, which is likewise a transconductance amplifier. The second amplifier, the same as first amplifier 21, is a differential amplifier.

A first input of second amplifier 36 is connected to first input capacitor Cin1 via a first offset capacitor Coff1 of integrator 3. A first output of second amplifier 36 is connected to first output contact 35a of integrator 3. A second input of second amplifier 36 is connected to second input capacitor Cin2 via a second offset capacitor Coff2 of integrator 3. A second output of second amplifier 36 is connected to second output contact 35b of integrator 3.

First input capacitor Cin1 and first output contact 35a of integrator 3 are connected via a current path in which a first switching element 32a of the integrator and an integrator capacitor Cint1a are situated. During second time interval Φ2, a charge that results from the charge present in first boxing capacitor Cbox1 is integrated into first integrator capacitor Cint1a. In addition, the first input of second amplifier 36 is connected to first output contact 35a of integrator 3 via a second current path in which a second switching element 33a of the integrator and a first further capacitor Cxx1 are situated. This second current path is activated in first time interval Φ1 by closing second switching element 33a of integrator 3.

Second input capacitor Cin2 and second output contact 35b of integrator 3 are connected via a current path in which a further first switching element 32b of the integrator and a further integrator capacitor Cint1b are situated. During second time interval Φ2, a charge that results from the charge present in second boxing capacitor Cbox2 is integrated into further first integrator capacitor Cint1b. In addition, the second input of second amplifier 36 is connected to second output contact 35b of integrator 3 via a second current path in which a further second switching element 33b of integrator 3 and a second further capacitor Cxx2 are situated. This second current path is activated in first time interval Φ1 by closing further second switching element 33b of integrator 3.

The current paths situated between the inputs and the outputs of second amplifier 36, together with integrator capacitors Cint1a, Cint1b and further capacitors Cxx1, Cxx2, make it possible for a value that is integrated in integrator 3 to also be obtained during first time interval Φ1, and an integration process may be carried out over multiple successive second time intervals Φ2.

In addition, integrator 3 includes a first ground switch 31a and a second ground switch 34a in the first differential current path. First ground switch 31a is configured to discharge first input capacitor Cin1 in first time interval Φ1. Second ground switch 31a is configured to couple an input-side potential of first further capacitor Cxx1 to circuit ground 80. Furthermore, integrator 3 includes a third ground switch 31b and a fourth ground switch 34b in the second differential current path. Third ground switch 31b is configured to discharge second input capacitor Cin2 in first time interval Φ1. Fourth ground switch 34b is configured to couple an input-side potential of second further capacitor Cxx2 to circuit ground 80.

Integrator 3 is thus configured, in second time interval Φ2, to integrate a voltage, present across first boxing capacitor Cbox1 and second boxing capacitor Cbox2, over their time curve, and to output a resulting output voltage Voint to output 35a, 35b of integrator 3.

A first input contact 40a of hold circuit 4 is connected to first output contact 35a of integrator 3. A second input contact 40b of hold circuit 4 is connected to second output contact 35b of integrator 3.

Hold circuit 4 includes a third amplifier 45, which is a differential transconductance amplifier. A first input of third amplifier 45 is coupled to first input contact 40A of hold circuit 4, the first input of third amplifier 45 being coupled to first input contact 40A of hold circuit 4 via a first switching element 41a of hold circuit 4 and a first hold capacitor 43a. A second input of third amplifier 45 is coupled to second input contact 40b of hold circuit 4 via a further first switching element 41b of hold circuit 4 and a second hold capacitor 43b. Third amplifier 45 is connected as an integrator. The first input of third amplifier 45 is thus connected to a first output of third amplifier 45 via a second integrator capacitor Cint2a. Similarly, the second input of third amplifier 45 is coupled to the second output of third amplifier 45 via a second integrator capacitor Cint2b.

In first time interval Φ1, hold capacitors 43a, 43b are separated from output 35a, 35b of integrator 3 by the two first switching elements 41a, 41b of hold circuit 4. In second time interval Φ2, output voltage Voint of integrator 3 is tapped by hold circuit 4 and held as hold voltage Vo_zm at an output of hold circuit 4. For this purpose, first switching elements 41a, 41b are closed in second time interval Φ2, as the result of which output voltage Voint of integrator 3 is also present at the input of third amplifier 45. Since the third amplifier is connected as an integrator and is separated from input contacts 40A, 40B of hold circuit 4 via hold capacitors 43a, 43b, output voltage Voint of integrator 3 is also present as hold voltage Vo_zm at the output of third amplifier 45 after the switching of first switching elements 41a, 41b, and thus at an output of hold circuit 4. Output voltage Voint of integrator 3 is optionally acted on by an amplifying factor in order to generate hold voltage Vo_zm. The output of hold circuit 4 includes a first output contact 46a of the hold circuit and a second output contact 46b of hold circuit 4.

Prior to closing switching elements 41a, 41b in second time interval Φ2, a number of reset switches 42a, 42b, 44a, 44b are switched in hold circuit 4, in particular at the end of first time interval Φ1, in order to discharge the capacitors situated therein. Thus, in particular a first reset switch 44a, 44a [sic] is in each case switched in parallel to one of second integrator capacitors Cint2a, Cint2b in order to discharge it in a reset interval. In addition, a contact of hold capacitors 43a, 43b is preferably coupled to circuit ground 80, in each case via a second reset switch 42a, 42b, in order to discharge hold capacitors 43a, 43b in the reset interval.

Hold circuit 4 is configured to tap output voltage Voint of integrator 3 in second time interval Φ2, and hold it as hold voltage Vo_zm at an output of hold circuit 4. Hold voltage Vo_zm present at output 46a, 46b of hold circuit 4 is provided to analog-digital converter 11. For this purpose, the inputs of analog-digital converter 11 are preferably directly connected to output contacts 46a, 46b of hold circuit 4. In addition, hold voltage Vo_zm is provided as feedback voltage to capacitive sensor 10, at least in first time interval Φ1, preferably in first time interval and second time interval Φ1, Φ2. This means that there is at least one feedback path between the output of hold circuit 4 and sensor inputs 11, 13 of capacitive sensor 10. Switching elements, for example feedback switches 41 through 68, are also situated in the feedback path, via which it may be defined when, and with what polarity, the voltage present at first output contact 46A and second output contact 46B of hold circuit 4 is applied to capacitive sensor 10.

In particular a first feedback voltage, which results from a voltage that is present at a common mode potential of circuit 1, also referred to as common mode voltage, and that is one-half the hold voltage, is provided by first output terminal 46a of hold circuit 4. The first feedback voltage is thus equal to the common mode voltage plus one-half hold voltage Vo_zm. Similarly, a second feedback voltage that corresponds to the common mode voltage minus one-half hold voltage Vo_zm is provided at second output contact 46b of hold circuit 4.

During operation of sensor device 100, second input contact 20b of GM stage 2 is either switched into a floating state, or, as shown in FIG. 2, coupled to circuit ground 80 via second ground capacitor 75, in second time interval Φ2. The specific embodiment of second input contact 20b of GM stage 2 shown in FIG. 2 is continuously connected to circuit ground 80 via second ground capacitor 75.

Second input contact 2b of GM stage 2 is coupled to the output of hold circuit 4 via the feedback path in first time interval Φ1. During first chopping interval chop, second input contact 20b of GM stage 2 is coupled to the output of hold circuit 4 via fourth input potential switch 74 in such a way that that the first feedback voltage is present at second input contact 20b of GM stage 2. In addition, during first time interval Φ1 during second chopping interval chopb, second input contact 20b of GM stage 2 is coupled to the output of hold circuit 4 via third input potential switch 73 in such a way that the second feedback voltage is present at second input contact 20B of GM stage 2. Similarly, in first time interval Φ1, first input contact 20a is coupled to the output of hold circuit 4 via first input potential switch 71 and second input potential switch 72 in such a way that the first feedback voltage is present at first input contact 20a of the GM stage in first chopping time interval chop, and the second feedback voltage is present at first input contact 20a of GM stage 2 in second chopping interval chopb. Circuit 1 is thus configured to couple second input contact 20a of GM stage 2 to output 46a, 46b of hold circuit 4 in first time interval Φ1 of first chopping time interval chop in such a way that a voltage that results from a common mode voltage Vcm plus one-half hold voltage Vo_zm is present at the output.

In addition, circuit 1 is thus configured to couple second input contact 20b of GM stage 2 to the output of hold circuit 4 in first time interval Φ1 of second chopping time interval chopb in such a way that a voltage that results from common mode voltage Vcm minus one-half hold voltage Vo_zm is present at the output.

In first time interval Φ1, during first chopping time interval chop the first feedback voltage is applied to the first sensor input by fifth feedback switch 65, and the first feedback voltage is applied to the second sensor input by sixth feedback switch 66. In first time interval Φ1, during second chopping time interval chopb the second feedback voltage is applied to first sensor input 11 by seventh feedback switch 67, and the second feedback voltage is applied to second sensor input 13 by eighth feedback switch 68. A potential of capacitive sensor 10 is thus increased or decreased as a whole, as a function of the chopping time interval that is present.

During second time interval Φ2, during first chopping time interval chop a positive reference voltage Vsp is applied to first sensor input 11 by first feedback switch 61, and negative reference voltage Vsn is applied to second sensor input 13 via a second feedback switch 62. During second time interval Φ2, during second chopping interval chopb the negative reference voltage is applied to first sensor input 11 via third feedback switch 63, and is applied to second sensor input 13 via fourth feedback switch 64. The polarity of the input voltage of capacitive sensor 10 thus changes as a function of the chopping time interval that is present.

The mode of operation of the circuit shown in FIG. 2 may be summarized as follows. An input side of shown circuit 1 is formed by a capacitive sensor 10, for example an individual core of a capacitive MEMS sensor. First a GM stage 2, then an integrator 3, and lastly a hold circuit 4 follow on capacitive sensor 10 in a signal processing chain. Capacitive sensor 10 corresponds to a capacitive bridge. A delta C/C concept is implemented, two voltages of the same magnitude and reversed polarity being applied to the two sides of the capacitive bridge. An output signal of capacitive sensor 10 results, in a proportional manner, from changeable capacitors C1, C2 of capacitive sensor 10.

This output signal, which is provided at sensor output 12, is proportional to an acceleration at a common mode electrode, and thus at sensor output 12. The signal that is output by capacitive sensor 10 is sampled by GM stage 2 with a sampling time T, and in turn is sampled by boxing capacitors Cbox1 and Cbox2 in order to accumulate a charge in boxing capacitors Cbox1, Cbox2. This charge is then integrated, the integration being carried out by integrator 3, and an amplification taking place that results from a ratio between the capacitances of the integrator, in particular the input capacitances to the integrator capacitances.

The output voltage of integrator 3 is transferred to hold circuit 4, which subsequently provides it at capacitive sensor 10 and analog-digital converter 11 during first time interval Φ1 and second time interval Φ2. The hold capacitors are reset for a short time in a reset time period rst before a new output value of integrator 3 is tapped in a subsequent second time interval Φ2. This hold voltage is led back to the capacitive sensor and also provided at the input of GM stage 2. A voltage difference of capacitive sensor 10 may thus be set, either the capacitive sensor 10 being acted on by one-half the hold voltage, or one-half hold voltage Vo_zm being subtracted from the voltage that is present, as a function of a chopping time interval that is present.

Thus, for example in first chopping time interval chop of second time interval Φ2, a positive reference voltage Vs plus the hold voltage are present at first sensor input 11, and thus in addition to resulting output voltage Voint of integrator 3. At the same time, the negative reference voltage plus hold voltage Vo_zm are present at second sensor input 13, and thus in addition to resulting output voltage Voint of integrator 3.

Positive reference voltage Vs minus the hold voltage are thus present at first sensor input 11, for example in second chopping time interval chopb of first time interval Φ1. At the same time, negative reference voltage −Vs minus hold voltage Vo_zm are present at second sensor input 13.

Hold voltage Vo_zm and thus also a value of resulting output voltage Voint of integrator 3 are also transferred to an analog-digital converter 11, which digitizes this hold voltage and converts it into a bitstream. At the output of hold circuit 4, the output voltage is equivalent to a value (OC/SC) multiplied by positive reference voltage Vs. Integrator 3 and an integrator of analog-digital converter 11, in particular when the latter is designed as a sigma-delta modulator, carry out an offset cancellation.

In first time interval Φ1, resulting output voltage Voint of integrator 3, which has been output by integrator 3 in a preceding time interval, is applied to both sides of the capacitive bridge of capacitive sensor 10, and in addition is provided at a common mode electrode, which corresponds to sensor output 12 of capacitive sensor 10. If a dummy capacitor is optionally utilized, negative resulting output voltage −Voint is provided at the negative path of capacitive sensor 10. Due to a number of chopping switches, the voltage present at capacitive sensor 10 is switched in such a way that in alternation, resulting output voltage Voint is present between the first sensor input and second sensor input 13, and in the subsequent chopping time interval, negative resulting output voltage −Voint is present between first sensor input 11 and second sensor input 13. In addition, in first time interval Φ1, GM stage 2 is reset, and an input of integrator 3 is reset to common mode voltage Vcm. Integrator 3 samples the offset voltage of offset capacitors Coff1 and Coff2. Hold circuit 4 continues to provide resulting output voltage Voint of integrator 3 from preceding second time interval Φ2.

In second time interval Φ2, reference voltage Vs is provided at the two sensor inputs 11, 13 of the capacitive bridge of capacitive sensor 10, positive reference voltage Vs (Vsp) being provided at first capacitor C1, and negative reference voltage −Vs (Vsn) being provided at second capacitor C2. In a subsequent chopping time interval, the polarity of the reference voltage is reversed, and the negative reference voltage is thus applied to first capacitor C1 and positive reference voltage Vs is applied to second capacitor C2. In this state, sensor output 12 is held in a floating state so that the voltage at sensor output 12 may be adapted corresponding to an acceleration value that is present, via which capacitors C1, C2 of capacitive sensor 10 are changed. The above-described integration by integrator 3 is carried out in second time interval Φ2. The voltages present at capacitive sensor 10, i.e., the voltages that are present at the first sensor input and at second sensor input 13, may be exchanged. Thus, for example, in first time interval Φ1, positive reference voltage Vsp may be applied to first capacitor C1 and negative reference voltage Vsn may be applied to second capacitor C2 of capacitive sensor 10, and in second time interval Φ2, resulting output voltage Voin, correspondingly inverted, may be applied to capacitive sensor 10.

Boxcar sampling is thus made possible by GM stage 2. The basic concept of boxcar sampling is to minimize noise from a signal by integrating the signal over a predetermined time period and sampling the signal at the end of the integration phase in order to provide this signal to a subsequent stage and to once again reset the input signal. Thus, this corresponds to windowed filtering, in each case a certain time period being considered and an average value being formed. Particularly effective anti-aliasing filtering is thus made possible, since such a filter has an early roll-off and periodic zero points, and noise at the input of such a boxcar function is therefore significantly reduced.

In circuit 1 according to the present invention, a dependency between noise of integrator 3 and the sensor parameters is thus reduced, thereby achieving greater flexibility in selecting the sensor capacitors and their values, and also in selecting integrator capacitors C1. Without GM stage 2, a parasitic capacitance at an output of capacitive sensor 10, which would occur in a feedback parameter, would be present. The density of the sampled noise values would thus be reduced, and a feedback factor would decrease. However, according to the present invention the sensor parameters would be subjected to boxcar sampling and their influence on noise would thus be reduced. In addition, an influence of a parasitic capacitor of the capacitive sensor is greatly reduced due to the fact that GM stage 2 is situated upstream from integrator 3. Furthermore, noise of integrator 3 is now greatly reduced by an amplification of the GM stage, thereby once again decreasing a contribution of integrator 3 to noise of overall circuit 1. In addition, the amplification requirements for the amplifier stage of integrator 3 are reduced, since a necessary amplification may be achieved from a combination of the amplifiers of GM stage 2 and integrator 3, as the result of which the requirements for the integrating capacitors of integrator 3 may be reduced.

Figure 3A:
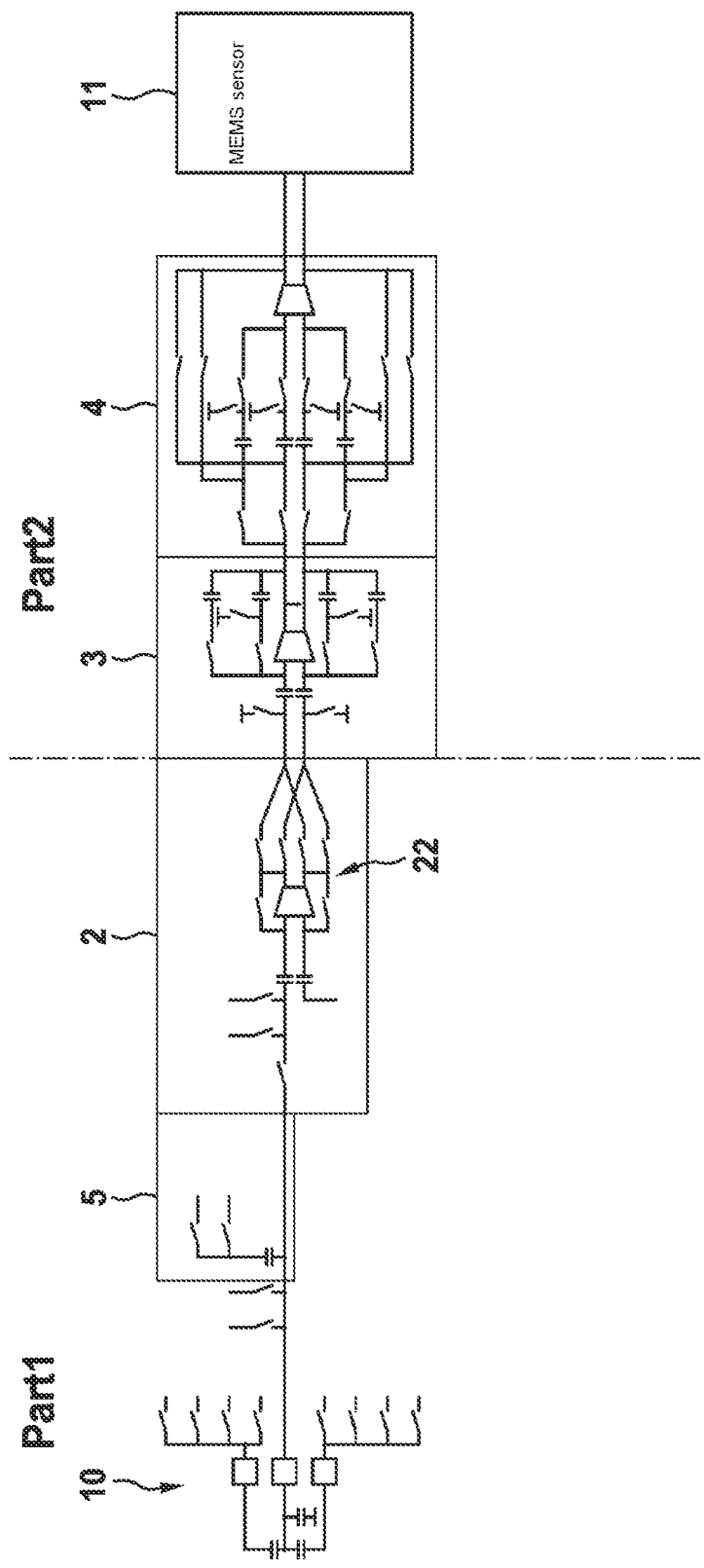

FIGS. 3A and 3B show a further specific embodiment of the present invention. The basic principle of the circuit shown in FIGS. 3A and 3B corresponds to the circuit shown in FIG. 2.

However, boxing capacitors Cbox1, Cbox2 at an output of GM stage 2, and input capacitors Cin1, Cin2 at an input of integrator 3, are removed. This has the advantage that output 30a, 30b of GM stage 2 is at virtual ground at any point in time, and the amplification of GM stage 2 is stable. The function of boxing capacitors Cbox1, Cbox2 is taken over by integrator capacitors Cint1a, Cint1b.

In this design, stability of the circuit may be ensured only by integrator capacitors Cint1a, Cint1b, which allows less flexibility compared to the design with dedicated boxing capacitors Cbox1, Cbox2 and input capacitors Cin1, Cin2. However, in other respects, the behavior of circuit 1 remains the same as in the specific embodiment shown in FIG. 2.

A further difference is that the dummy capacitors have been removed, and a common mode voltage Vcm of circuit 1 is applied to second input contact 20b of GM stage 2. This results in a further reduction of noise of circuit 1.

The circuit shown in FIGS. 3A and 3B may be operated in three phases. A time signal is subdivided into three phases or time intervals. In first time interval Φ1, an offset cancellation takes place in integrator 3, and the offset of integrator 3 is sampled by offset capacitors Coff and further capacitors Cxx.

Chopping circuit 22 on the output side of GM stage 2 is modified in such a way that it operates not only as a function of chopping time intervals chop, chopb, but also as a function of second time interval Φ2 and a third time interval Φ3. It is thus possible to change an algebraic sign of the integrated signal. Thus, in second time interval Φ2 only the offset is integrated, and in third time interval Φ3 the offset and the signal are integrated, but with an opposite algebraic sign compared to second time interval Φ2. Hold circuit 4 detects the output voltage of integrator 3 in third time interval Φ3 and holds it at least in first time interval and second time interval Φ1, Φ2, so that it may be used to provide the feedback voltages for capacitive sensor 11 and the input of GM stage 2. The feedback voltages are optionally also provided for neutralization capacitors 5.

Circuit 1 according to the present invention is preferably a readout circuit or driver circuit for an acceleration sensor, but may also be a readout circuit for a gyroscope or some other capacitive sensor.

In addition to the above disclosure, reference is explicitly made to the disclosure of FIGS. 1 through 3B.

What is claimed is:

1. A circuit for operating a capacitive sensor that is configured to be operated alternately in a first mode over a first time interval and in a second mode over a second time interval, the circuit comprising:
    a GM stage that includes a first input contact and a second input contact, and that is configured to receive a sensor voltage of the capacitive sensor at the first input contact of the GM stage and to convert the sensor voltage into a sensor current in order to charge a first boxing capacitor with the sensor current in the second time interval;
    an integrator that is configured, in the second interval, to integrate a voltage applied across the first boxing capacitor over its time curve and to output an output voltage resulting from the integration at a first output of the integrator; and
    a hold circuit that is configured to tap the output voltage of the integrator in the second interval and to hold the output voltage of the integrator as a hold voltage at an output of the hold circuit;
    wherein the circuit is configured to:
        provide, in the first time interval and/or in the second time interval, the hold voltage to the capacitive sensor as a feedback voltage and to an analog-digital converter as input voltage to be converted, and
        discharge the first boxing capacitor in the first time interval.

2. The circuit as recited in claim 1, wherein the GM stage, the integrator, and the hold circuit are differential circuits.

3. The circuit as recited in claim 1, wherein the circuit is configured to switch the second input contact of the GM stage into a floating state in the second time interval, or to couple the second input contact to a circuit ground in the second time interval via a ground capacitor.

4. The circuit as recited in claim 1, wherein the circuit is configured to couple the second input contact of the GM stage to the output of the hold circuit in the first time interval.

5. The circuit as recited in claim 1, wherein the GM stage also includes a chopping circuit that is configured to lead the sensor current to the first boxing capacitor in a first chopping time interval, and to a second boxing capacitor in a second chopping time interval, to charge the first and second boxing capacitors with the sensor current in the second time interval of the first and second chopping time interval, respectively.

6. The circuit as recited in claim 5, wherein the circuit is configured to:
  couple the second input contact of the GM stage, via a feedback path, to the output of the hold circuit in the first time interval of the first chopping time interval in such a way that a voltage that results from a common mode voltage plus one-half the hold voltage is present at the output of the hold circuit, and
  couple the second input contact of the GM stage, via a feedback path, to the output of the hold circuit in the first time interval of the second chopping time interval in such a way that a voltage that results from the common mode voltage minus one-half the hold voltage is present at the output of the hold circuit.

7. The circuit as recited in claim 6, wherein the circuit includes a neutralization capacitor, a first side of the neutralization capacitor being coupled to the first input contact of the GM stage, and a second side of the neutralization capacitor being configured to be selectively:
  coupled to the output of the hold circuit in such a way that at the second side of the neutralization capacitor, a voltage that results from the common mode voltage plus one-half the hold voltage is present, or
  coupled to the output of the hold circuit in such a way that at the second side of the neutralization capacitor, a voltage that results from the common mode voltage minus one-half the hold voltage is present.

8. The circuit as recited in claim 1, wherein the first boxing capacitor and/or the second boxing capacitor, is a capacitor of the integrator.

9. The circuit as recited in claim 1, wherein the capacitive sensor is a MEMS acceleration sensor, or a MEMS gyroscope.

10. A sensor device, comprising:
  a circuit for operating a capacitive sensor that is configured to be operated alternately in a first mode over a first time interval and in a second mode over a second time interval, the circuit including:
    a GM stage that includes a first input contact and a second input contact, and that is configured to receive a sensor voltage of the capacitive sensor at the first input contact of the GM stage and to convert the sensor voltage into a sensor current in order to charge a first boxing capacitor with the sensor current in the second time interval;
    an integrator that is configured, in the second interval, to integrate a voltage applied across the first boxing capacitor over its time curve and to output an output voltage resulting from the integration at a first output of the integrator; and
    a hold circuit that is configured to tap the output voltage of the integrator in the second interval and to hold the output voltage of the integrator as a hold voltage at an output of the hold circuit;
  wherein the circuit is configured to:
    provide, in the first time interval and/or in the second time interval, the hold voltage to the capacitive sensor as a feedback voltage and to an analog-digital converter as input voltage to be converted, and
    discharge the first boxing capacitor in the first time interval; and
  the capacitive sensor, the capacitive sensor including two capacitive elements that are connected to form a bridge, and a shared potential of the capacitive elements is coupled to the first input contact of the GM stage, and external contacts of the bridge are coupled to the output of the hold circuit to be acted on by the hold voltage.

* * * * *